United States Patent
Sun et al.

(10) Patent No.: US 8,841,195 B2
(45) Date of Patent: Sep. 23, 2014

(54) SEMICONDUCTOR DEVICE WITH MULTI-LAYERED STORAGE NODE AND METHOD FOR FABRICATING THE SAME

(75) Inventors: Jun-Hyeub Sun, Gyeonggi-do (KR);
Sang-Oh Lee, Gyeonggi-do (KR);
Su-Young Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 193 days.

(21) Appl. No.: 13/607,293

(22) Filed: Sep. 7, 2012

(65) Prior Publication Data
US 2013/0328196 A1    Dec. 12, 2013

(30) Foreign Application Priority Data
Jun. 11, 2012    (KR) .................. 10-2012-0062199

(51) Int. Cl.
*H01L 21/20* (2006.01)
*H01L 21/02* (2006.01)
*H01L 21/768* (2006.01)
*H01L 27/108* (2006.01)

(52) U.S. Cl.
CPC .............................. *H01L 27/10894* (2013.01)
USPC ................... 438/381; 438/386; 257/E21.008; 257/E21.584; 257/E27.084

(58) Field of Classification Search
CPC .................................................. H01L 27/10894
USPC ........... 438/381, 386; 257/E21.008, E21.584, 257/E27.084
See application file for complete search history.

(56) References Cited

U.S. PATENT DOCUMENTS

| 2006/0186449 A1 | 8/2006 | Uchiyama | |
| 2011/0121377 A1* | 5/2011 | Jin | 257/301 |
| 2012/0205733 A1* | 8/2012 | Kang | 257/311 |
| 2012/0205779 A1* | 8/2012 | Kim | 257/532 |

FOREIGN PATENT DOCUMENTS

| KR | 1020040072086 | 8/2004 |
| KR | 1020040086649 | 10/2004 |
| KR | 1020060074715 | 7/2006 |
| KR | 1020070081642 | 8/2007 |
| KR | 1020100119445 | 11/2010 |
| KR | 1020110001339 | 1/2011 |
| KR | 1020110078020 | 7/2011 |
| KR | 1020110097334 | 8/2011 |
| KR | 1020120092951 | 8/2012 |

\* cited by examiner

*Primary Examiner* — Luan C Thai
(74) *Attorney, Agent, or Firm* — IP & T Group LLP

(57) ABSTRACT

A method for fabricating a semiconductor device includes forming a first dielectric structure over a second region of a substrate to expose a first region of the substrate, forming a barrier layer over an entire surface including the first dielectric structure, forming a second dielectric structure over the barrier layer in the first region, forming first open parts and second open parts in the first region and the second region, respectively, by etching the second dielectric structure, the barrier layer and the first dielectric structure, forming first conductive patterns filled in the first open parts and second conductive patterns filled in the second open parts, forming a protective layer to cover the second region, and removing the second dielectric structure.

30 Claims, 11 Drawing Sheets

SEMICONDUCTOR DEVICE WITH MULTI-LAYERED STORAGE NODE AND METHOD FOR FABRICATING THE SAME

CROSS-REFERENCE TO RELATED APPLICATIONS

The present application claims priority of Korean Patent Application No. 10-2012-0062199, filed on Jun. 11, 2012, which is incorporated herein by reference in its entirety.

BACKGROUND

1. Field

Exemplary embodiments of the present invention relate to a method for fabricating a semiconductor device, and more particularly, to a semiconductor device with a multi-layered storage node and a method for fabricating the same.

2. Description of the Related Art

In a DRAM, a capacitance (Cs) of a capacitor, e.g., a capacitor formed by using under-30 nm process, decreases with reduction in a pitch size. Accordingly, in order to increase the capacitance, open parts with a high aspect ratio, e.g., an aspect ratio of 30 or over, are formed and an etching process for forming the open parts is to be used in a DRAM fabrication process. The open parts are obtained by etching a mold layer, and storage nodes are formed in the open parts. As the height of the storage nodes increases, a high aspect ratio etching process is to be used. Since the high aspect ratio etching process is difficult to perform, a method of stacking storage nodes into at least two layers has been proposed. For example, a generally known method for forming storage nodes into double layers may be performed in the sequence of forming a first mold layer, forming first open parts, forming first storage nodes, forming a second mold layer, forming second open parts and forming second storage nodes.

Such a method for forming storage nodes into at least two layers is a costly process with a markedly increased number of processing steps.

Furthermore, as the height of storage nodes increases, the height of a mold layer increases as well. Thus, the layer of metal contacts (M1C) is heightened. Here, the metal contacts (M1C) refer to contacts for connecting metal lines (M1) with plates of capacitors. Also, the metal contacts refer to contacts for the metal lines (M1) which are connected to bit lines with sources/drains of transistors of a peripheral circuit region.

In the case where the height of a mold layer is increased to secure the capacitance of capacitors, an aspect ratio increases as the depth of contact holes for metal contacts formed in the peripheral circuit region increases. Due to this fact, contact holes may not be open during an etching process or a bottom critical dimension decreases even when the contact holes are open, which leads to poor filling of metal contacts in the contact holes.

SUMMARY

Embodiments of the present invention are directed to a semiconductor device which may secure a capacitance by forming a multi-layered storage node, and a method for fabricating the same.

Embodiments of the present invention are directed to a semiconductor device which may decrease the number of processing steps by forming a storage node in a cell region and forming a metal line in a peripheral circuit region, and a method for fabricating the same.

Embodiments of the present invention are directed to a semiconductor device which may prevent the occurrence of poor opening of contact holes and poor filling of metal contacts due to a high aspect ratio of the metal contact, and a method for fabricating the same.

In accordance with an embodiment of the present invention, a semiconductor device includes: a substrate including a cell region and a peripheral circuit region; a dielectric structure covering the substrate in the peripheral circuit region; a barrier layer formed over an entire surface of the cell region and the peripheral circuit region including the dielectric structure; a plurality of storage nodes formed over the substrate in the cell region and passing through the barrier layer; a plurality of metal lines formed over the substrate in the peripheral circuit region and passing through the barrier layer and the dielectric structure; and a protective layer covering the plurality of metal lines.

In accordance with another embodiment of the present invention, a method for fabricating a semiconductor device includes: forming a first dielectric structure over a second region of a substrate to expose a first region of the substrate; forming a barrier layer over an entire surface including the first dielectric structure; forming a second dielectric structure over the barrier layer in the first region; forming first open parts and second open parts in the first region and the second region, respectively, by etching the second dielectric structure, the barrier layer and the first dielectric structure; forming first conductive patterns filled in the first open parts and second conductive patterns filled in the second open parts; forming a protective layer to cover the second region; and removing the second dielectric structure.

In accordance with yet another embodiment of the present invention, a method for fabricating a semiconductor device includes: forming a first dielectric structure over a peripheral region of a substrate to expose a cell region of the substrate; forming a barrier layer over an entire surface including the first dielectric structure; forming a second dielectric structure over the barrier layer in the first region; forming first open parts and second open parts in the cell region and the peripheral circuit region, respectively, by etching the second dielectric structure, the barrier layer and the first dielectric structure; forming first storage nodes filled in the first open parts and metal lines filled in the second open parts; forming a protective layer to cover the peripheral circuit region; forming a mold layer over an entire surface including the protective layer, forming second storage nodes over the first storage nodes to be connected to the first storage nodes and filled in the mold layer; and removing the second dielectric structure and the mold layer.

DETAILED DESCRIPTION

Figure 1:
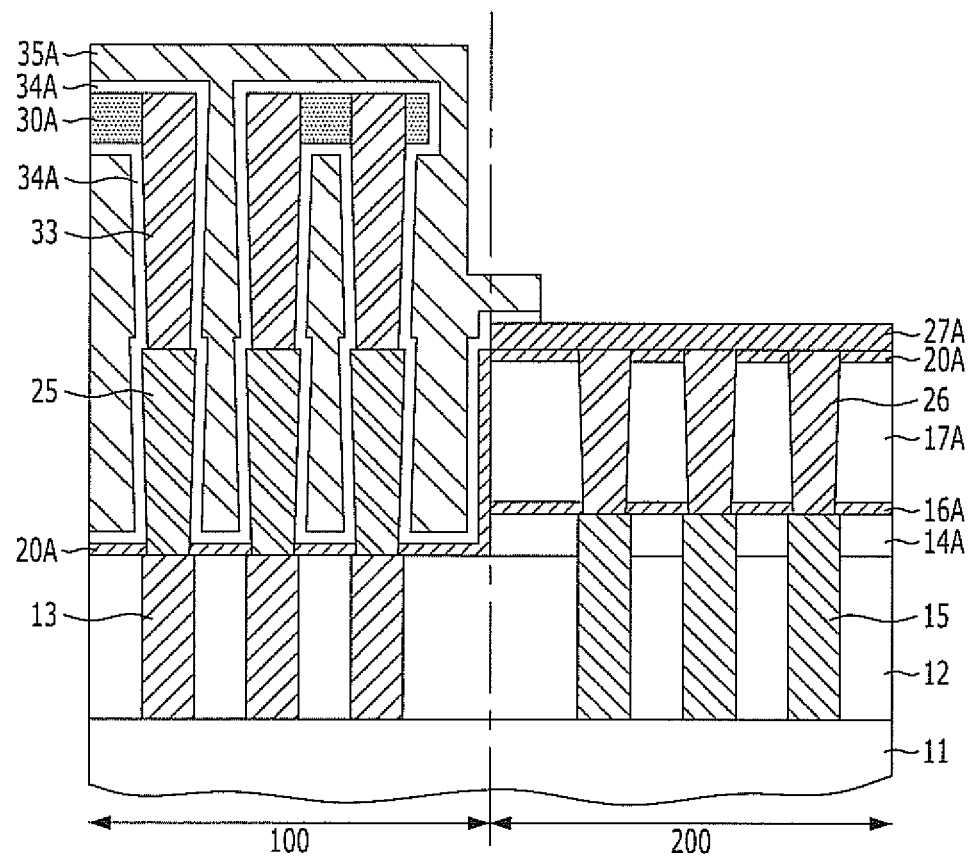
FIG. 1 is a cross-sectional view illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In an embodiment of the present invention described below, first storage nodes and metal lines (M0) are simultaneously formed and second storage nodes are formed on the first storage nodes, by which process simplification and capacitance increase through multi-layered capacitors may be simultaneously accomplished.

Although the first storage nodes and the metal lines (M0) are simultaneously formed, only a cell region is recessed so that the first storage nodes and the metal lines (M0) may perform their functions, and a second etch stop layer is deposited so that the first storage nodes and the metal lines (M0) are separated from each other. By forming the second etch stop layer in this way, the metal lines may be prevented from being dipped out when performing a wet dip-out process.

Also, in the embodiment of the present invention, by forming a protective layer to cover only a peripheral circuit region, the metal lines may be prevented from being dipped out when performing the wet dip-out process. Further, by forming the protective layer, the peripheral circuit region may be prevented from being damaged in a subsequent plate etching process.

In general, first metal lines M1 and second metal lines M2 are formed in two layers in a DRAM device, and contact plugs M1C are formed to connect the metal lines M1 with peripheral transistors.

In the embodiment, metal lines M0 are formed under the first metal lines M1, and contact plugs M0C are formed to connect the metal lines M0 with peripheral transistors.

In the embodiment, as M0 and M0C are additionally formed under M1, an M1C process margin may be secured. That is to say, in an M1C process, poor opening of contact holes and poor filling of M1C may be prevented.

FIG. 1 is a cross-sectional view illustrating the structure of a semiconductor device in accordance with an embodiment of the present invention.

Referring to FIG. 1, capacitors including multi-layered storage nodes are formed in a first region 100 of a substrate 11. Metal lines 26 are formed in a second region 200 of the substrate 11. The first region 100 may include a cell region, and the second region 200 may include a peripheral circuit region. The cell region refers to a region where memory cells including cell transistors are formed. The peripheral circuit region refers to a region where peripheral circuit lines constituting peripheral circuits such as sense amplifiers and peripheral transistors are formed.

First, as the multi-layered storage nodes, first storage nodes 25 and second storage nodes 33 may be stacked. The first storage nodes 25 and the second storage nodes 33 may have a pillar shape. Supporters 30A may be formed on the upper sidewalls of the multi-layered storage nodes. The supporters 30A prevent collapse of the storage nodes. For example, the supporters 30A may have such a configuration as to support the upper sidewalls of the second storage nodes 33.

The metal lines 26 are M0, and metal contacts 15 (M0C) may be formed under the metal lines 26. The metal lines 26 may have a line-like shape. The metal lines 26 may be formed through the same process as the first storage nodes 25. The metal lines 26 and the first storage nodes 25 may have the same height. That is to say, the upper surfaces of the metal lines 26 and the first storage nodes 25 may be flush with each other. The metal lines 26 may be formed in the stack structure of a second dielectric layer 14A, a first etch stop layer 16A and a third dielectric layer 17A.

A dielectric layer 34A and plate nodes 35A may be additionally formed over the storage nodes. One ends of the plate nodes 35A may extend to a boundary region between the second region 200 and the first region 100.

A protective layer 27A may be formed on the metal lines 26 in the second region 200. The protective layer 27A is formed only in the second region 200 and not in the first region 100.

Storage node contact plugs 13 may be formed under the first storage nodes 25. The metal contacts 15 may be formed under the metal lines 26.

A portion of a second etch stop layer 20A may extend along the boundary region between the first region 100 and the second region 200. The second etch stop layer 20A may serve not only as an etch stop layer in the first region 100 but also as a wet barrier layer in a wet dip-out process.

FIGS. 2A to 2M are cross-sectional views illustrating an exemplary method for fabricating a semiconductor device in accordance with an embodiment of the present invention.

Figure 2A:
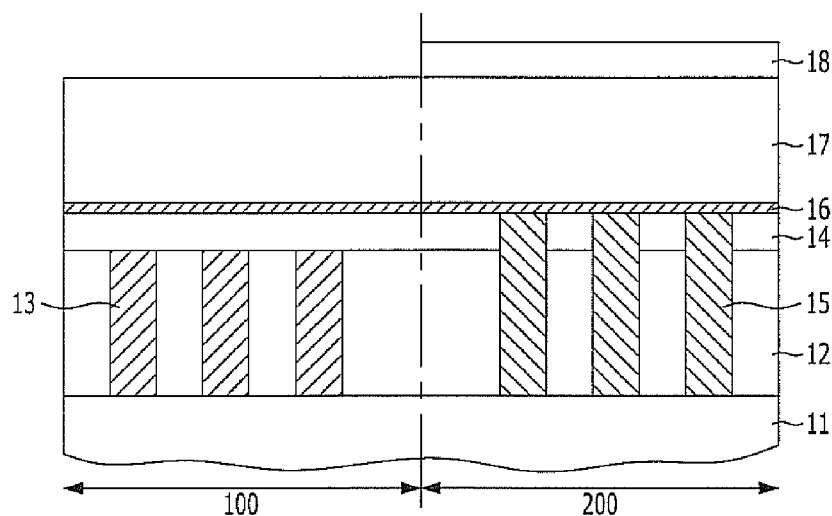
FIGS. 2A to 2M are cross-sectional views illustrating an exemplary method for fabricating a semiconductor device in accordance with an embodiment of the present invention.

Referring to FIG. 2A, a substrate 11 includes a first region 100 and a second region 200. The substrate 11 may include a silicon substrate. The first region 100 may include a cell region, and the second region 200 may include a peripheral circuit region. The cell region refers to a region where memory cells including cell transistors are formed. The peripheral circuit region refers to a region where peripheral circuit lines constituting peripheral circuits such as sense amplifiers and peripheral transistors are formed. While not shown, the substrate 11 may include isolation regions and may include a plurality of active regions which are separated by the isolation regions. The cell transistors and the peripheral transistors may be formed on the substrate 11. The cell transistors may have a buried gate structure. The peripheral transistors may have a planar gate structure. Furthermore, plugs such as landing plugs may be additionally formed on the substrate 11.

A first dielectric layer 12 is formed on the substrate 11. The first dielectric layer 12 may include a silicon oxide. The first dielectric layer 12 may be an interlayer dielectric (ILD) layer. A plurality of storage node contact plugs 13 are formed to pass through the first dielectric layer 12 in the first region 100. Bit lines (not shown) may be formed before or after forming the storage node contact plugs 13. The bit lines may be formed by adopting a known method (a masking and etching process) or through a damascene process. The plurality of storage node contact plugs 13 may be formed using a merged storage node contact process. For example, the merged storage node contact process is a process in which two storage node contact plugs respectively connected to active regions, that adjoin each other with an isolation region interposed therebetween, are simultaneously formed and are then separated from each other through a damascene process. The damascene process may include a process for forming the bit lines. A method for forming bit lines using a damascene process is as follows. First, trench-like damascene patterns are formed by etching a first dielectric layer and merged storage node contact plugs. Then, bit lines are formed by forming a titanium nitride (TiN) layer as a barrier metal layer and forming a tungsten (W) layer on the barrier metal layer. Bit line spacers (not shown) may be additionally formed on the sidewalls of the bit lines so as to secure sideward isolation from storage node contact plugs. Thereafter, a bit line capping layer may be formed on the bit lines as a dielectric layer such as a silicon nitride layer.

Next, a second dielectric layer 14 is formed. The second dielectric layer 14 may include a silicon oxide. The second dielectric layer 14 may be an interlayer dielectric (ILD) layer. Metal contacts 15 are formed to pass through the second dielectric layer 14 and the first dielectric layer 12 in the second region 200. The metal contacts 15 are called M0C. For example, the metal contacts 15 are formed through the following method. First, after defining contact holes by etching the second dielectric layer 14 and the first dielectric layer 12, a titanium nitride is formed as a barrier metal. Thereupon, the metal contacts 15 may be formed by filling a tungsten layer in the contact holes through a tungsten plugging process.

A first etch stop layer 16 is formed on the entire surface of the substrate 11 having the metal contacts 15. The first etch stop layer 16 may include a dielectric layer such as a silicon nitride.

A third dielectric layer 17 is formed on the first etch stop layer 16. The third dielectric layer 17 may include a silicon oxide. The third dielectric layer 17 may be an interlayer dielectric (ILD) layer.

A first mask 18 is formed on the third dielectric layer 17 to expose the first region 100 and cover the second region 200. The first mask 18 may be formed using a photoresist layer. Also, the first mask 18 may be formed using a hard mask layer. In the case where the second region 200 includes a peripheral circuit region, the first mask 18 may be a Peripheral Closed Mask (PCM).

Figure 2B:
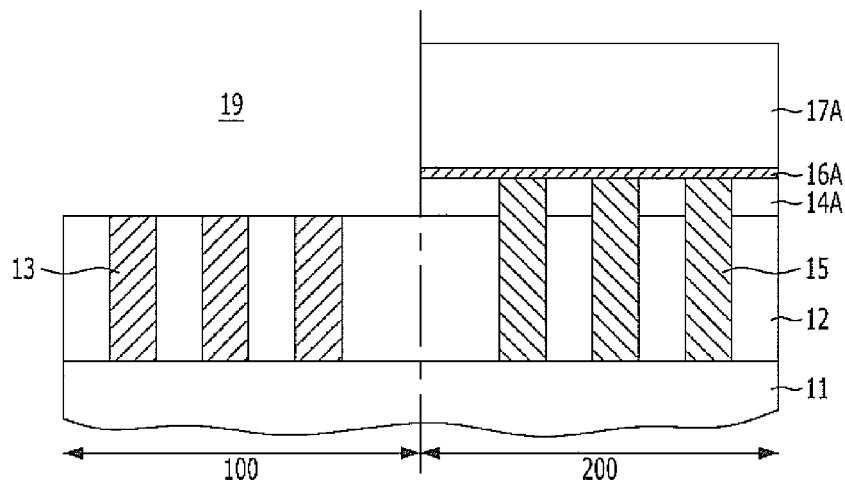

Referring to FIG. 2B, the third dielectric layer 17, the first etch stop layer 16 and the second dielectric layer 14 in the first region 100 are removed using the first mask 18 as an etch barrier. By this fact, a recess 19 is formed in the first region 100. By defining the recess 19 in this way, the surfaces of the storage node contact plugs 13 and the first dielectric layer 12 are exposed in the first region 100.

Further, by the recess 19, a step is formed between the first region 100 and the second region 200.

Figure 2C:
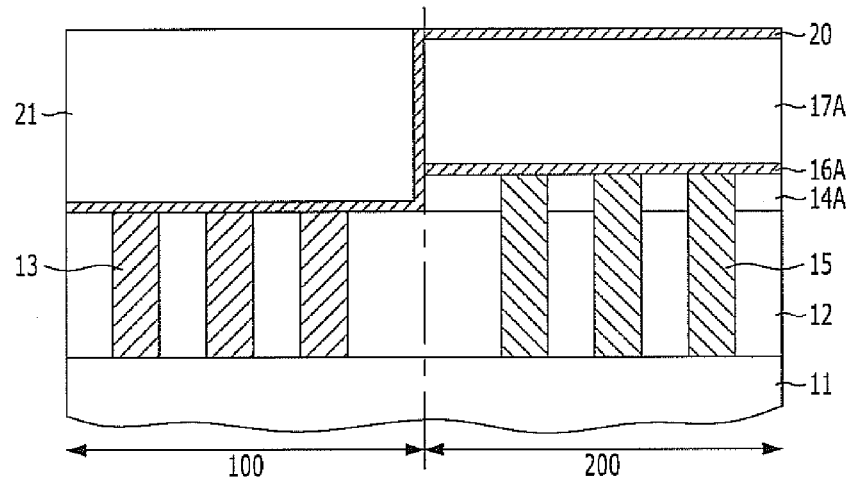

Referring to FIG. 2C, a second etch stop layer 20 is formed on the entire surface of the resultant structure including the recess 19. The second etch stop layer 20 may include a nitride layer such a silicon nitride layer. The second etch stop layer 20 may also serve as a barrier layer which prevents metal lines from being attacked in the second region 200 during a subsequent wet dip-out process. In other words, the second etch stop layer 20 may serve as a wet barrier which prevents the second dielectric layer 14A and the third dielectric layer 17A from being removed in the second region 200.

A fourth dielectric layer 21 is formed on the second etch stop layer 20. The fourth dielectric layer 21 may include a silicon oxide. The fourth dielectric layer 21 is removed during a wet dip-out process after subsequently forming first storage nodes. Therefore, the fourth dielectric layer 21 may be a mold layer which provides open parts in which the first storage nodes are to be formed. Subsequently, the fourth dielectric layer 21 may be planarized. According to this fact, the step between the first region 100 and the second region 200 is removed.

By planarizing the fourth dielectric layer 21 in this way, the fourth dielectric layer 21 remains only in the first region 100 and not in the second region 200. The second etch stop layer 20 has a shape which covers the dielectric layers in the second region 200. The fourth dielectric layer 21 may be formed to have a height (or thickness) corresponding to ½ of the total height of storage nodes. For example, when the storage nodes are formed to have a total height of about 20,000 Å, the fourth dielectric layer 21 may be formed to have a height of 10,000 Å. The total height of the storage nodes represents the total height of multi-layered storage nodes including the first storage nodes and second storage nodes.

Figure 2D:
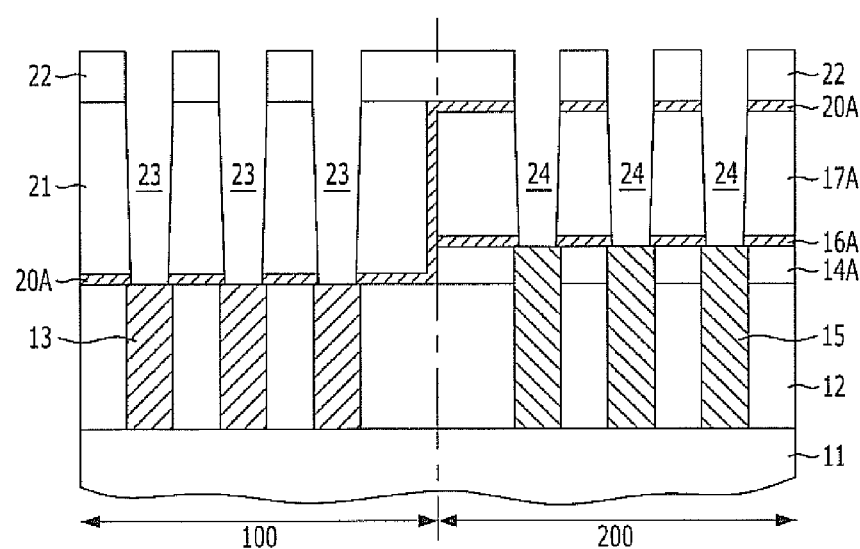

Referring to FIG. 2D, a second mask 22 is formed on the fourth dielectric layer 21. The second mask 22 has a shape in which patterns for forming first open parts in the first region 100 and patterns for forming second open parts in the second region 200 are merged together.

First open parts 23 and second open parts 24 are defined in the first region 100 and the second region 200, respectively. The first open parts 23 and the second open parts 24 may be simultaneously defined.

The first open parts 23 are defined by etching the fourth dielectric layer 21 using the second mask 22 as an etch barrier. When defining the first open parts 23, etching stops at the second etch stop layer 20. In succession, the storage node contact plugs 13 are exposed by etching second etch stop layer 20.

The second open parts 24 are defined by sequentially etching the second etch stop layer 20 and the third dielectric layer 17A using the second mask 22 as an etch barrier. When defining the second open parts 24, etching stops at the first etch stop layer 16A. In succession, the first metal contacts 15 are exposed by etching the first etch stop layer 16A.

The first open parts 23 and the second open parts 24 may be simultaneously formed using the second mask 22. The first open parts 23 are spaces, in which storage nodes are to be formed, and may be a hole type. The second open parts 24 are spaces, in which the metal lines are to be formed, and may be a trench type.

In the case where single exposure is difficult since a pitch size is small, the first open parts 23 and the second open parts 24 may be formed through a Hole Double Patterning Technology (HDPT) process.

As the first open parts 23 and the second open parts 24 are defined in this way, the second etch stop layer 20 may remain as indicated by the reference numeral 20A.

Figure 2E:
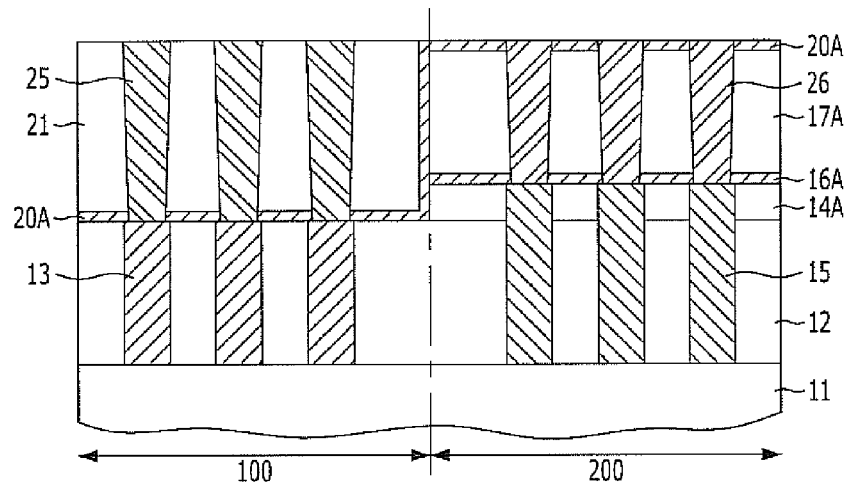

Referring to FIG. 2E, conductive patterns are formed to fill the first open parts 23 and the second open parts 24. First storage nodes 25 are filled in the first open parts 23. Metal lines (M0) 26 are filled in the second open parts 24. The first storage nodes 25 are a pillar type. The metal lines 26 are a line type. In order to form the first storage nodes 25 and the metal lines 26, a conductive layer may be deposited on the entire surface of the resultant structure to fill the first open parts 23 and the second open parts 24, and then, it may be planarized. As the conductive layer, a titanium (Ti) layer, a titanium nitride (TiN) layer or a tungsten (W) layer may be solely formed, otherwise a titanium layer, a titanium nitride layer and a tungsten layer may be stacked. When forming the conductive layer by stacking the titanium layer, the titanium nitride layer and the tungsten layer, the thickness of the titanium nitride layer is determined in consideration of overlay of the second storage nodes to be subsequently formed.

Figure 3:
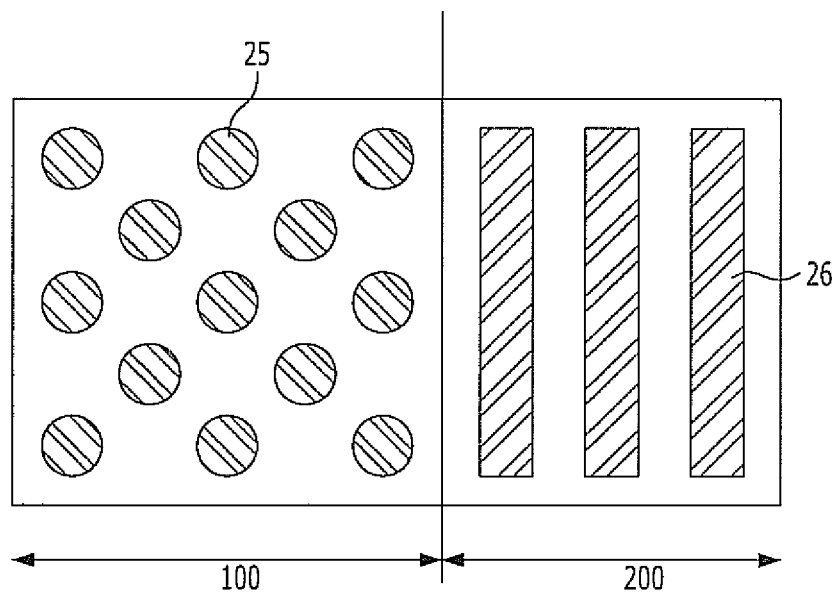
FIG. 3 is a plan view showing first storage nodes and metal lines.

FIG. 3 is a plan view showing first storage nodes and metal lines. The first storage nodes 25 have a pillar shape. The metal lines 26 have a line-like shape.

Figure 4:
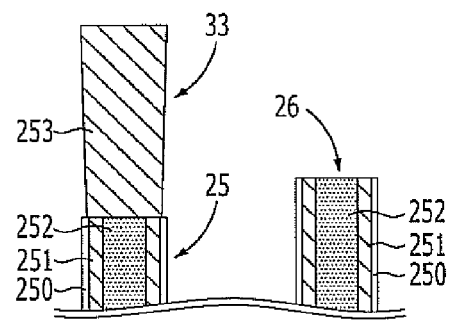
FIG. 4 is a detailed view showing the first storage node and the metal line.

FIG. 4 is a detailed view showing the first storage node and the metal line.

Referring to FIG. 4, the first storage nodes 25 and the metal lines 26 may be formed by stacking a titanium layer 250, a titanium nitride layer 251 and a tungsten layer 252. Second storage nodes 33 may be formed using a titanium nitride layer 253. When forming the first storage nodes 25 and the metal lines 26 by stacking the titanium layer 250, the titanium nitride layer 251 and the tungsten layer 252 in this way, the thickness of the titanium nitride layer 251 is determined in consideration of the overlay of the second storage nodes 33 which are to be subsequently formed. By this fact, the tungsten layer 252 of the first storage nodes 25 is prevented from being exposed during a subsequent process. By stacking the titanium layer 250, the titanium nitride layer 251 and the tungsten layer 252 as the metal lines 26, the resistance of the metal lines 26 may be reduced through the tungsten layer 252. Furthermore, since the first storage nodes 25 and the second storage nodes 33 are formed by the titanium nitride layers 251 and 253, capacitors may have a structure of a TiN/dielectric layer/TiN.

Figure 2F:
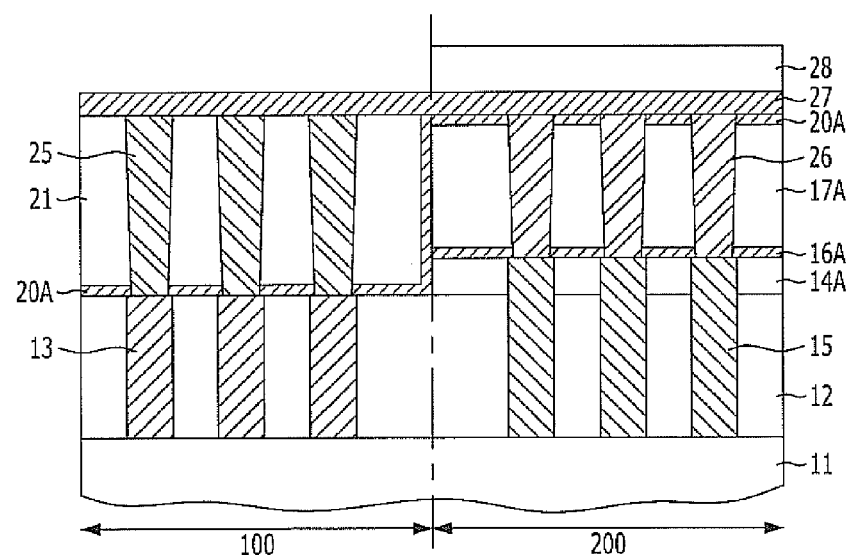

Referring to FIG. 2F, a third etch stop layer 27 is formed. The third etch stop layer 27 may include a nitride layer such a silicon nitride. A third mask 28 is formed on the third etch stop layer 27. The third mask 28 has a shape which exposes the first region 100 and covers the second region 200. The third mask 28 may be formed using a photoresist layer.

Figure 2G:
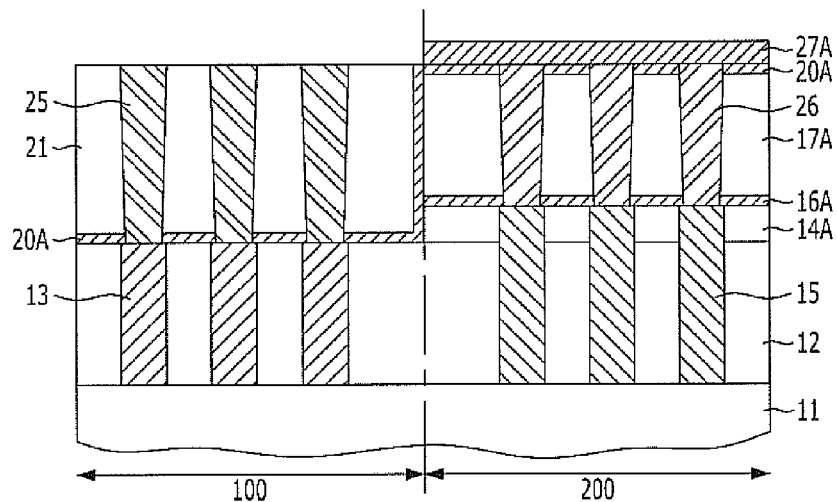

Referring to FIG. 2G, the third etch stop layer 27 in the first region 100 is removed using the third mask 28 as an etch barrier. According to this fact, a protective layer 27A is formed to cover the second region 200. The protective layer 27A serves to protect the second region 200 in a subsequent wet dip-out process. Also, the protective layer 27A serves to prevent the occurrence of a short circuit during a subsequent plate etching process. Moreover, the protective layer 27A may be used as an etch stop layer during subsequent M1C etching.

Figure 2H:
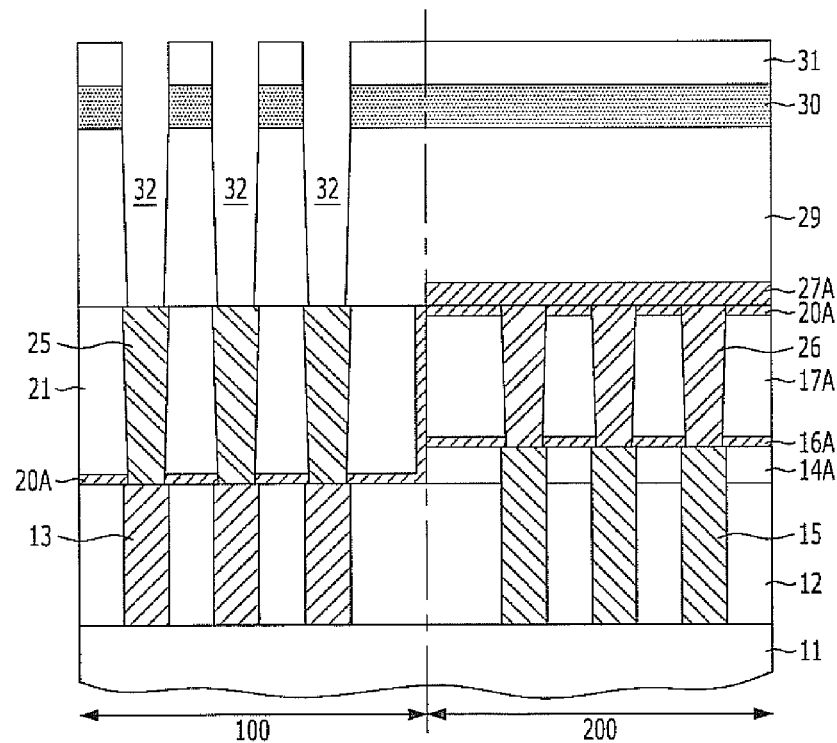

Referring to FIG. 2H, a mold layer 29 and a support layer 30 are stacked on the entire surface of the resultant structure including the protective layer 27A. The mold layer 29 may include an oxide layer such as a silicon oxide. For example, the mold layer 29 may be formed by solely forming PSG or PETEOS or by stacking PSG and PETEOS. The mold layer 29 may be formed to have a height (or thickness) corresponding to ½ of the total height of the storage nodes. For example, when the storage nodes are formed to have a total height of about 20,000 Å, the mold layer 29 may be formed to have a height of 10,000 Å.

The support layer 30 may include a nitride layer such as a silicon nitride. The support layer 30 may be formed as a dielectric layer which has an etching selectivity with respect to the mold layer 29. For example, the support layer 30 may include a silicon nitride ($Si_3N_4$). While not shown, a capping layer for protecting the support layer 30 during a subsequent etching process may be additionally formed on the support layer 30. The capping layer may include a silicon oxide ($SiO_2$).

A fourth mask 31 is formed on the support layer 30. The fourth mask 31 is a mask which forms patterns for defining third open parts in the first region 100. The third open parts are a hole type and are spaces in which the second storage nodes are to be formed.

The support layer 30 and the mold layer 29 are etched using the fourth mask 31. Accordingly, third open parts 32 are defined in the first region 100. The third open parts 32 may be a hole type. The first storage nodes 25 are exposed on the bottoms of the third open parts 32.

Figure 2I:
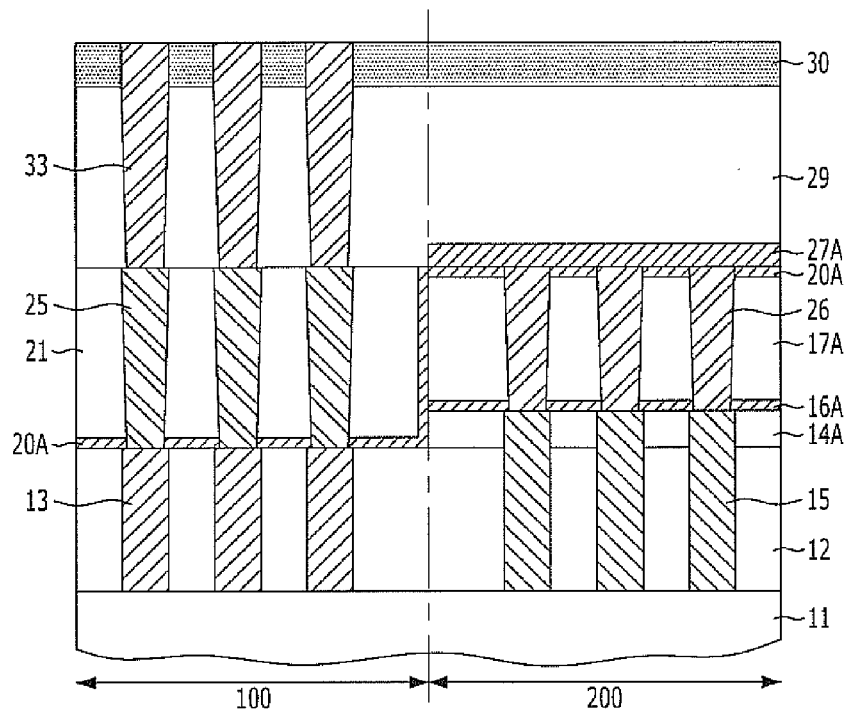

Referring to FIG. 2I, the second storage nodes 33 are formed to fill the third open parts 32. The second storage nodes 33 have a pillar shape. In order to form the second storage nodes 33, a conductive layer may be deposited on the entire surface of the resultant structure to fill the third open parts 32, and then, it may be planarized. The conductive layer may be formed as a titanium nitride (TiN) layer.

By forming the second storage nodes 33 in this way, multi-layered storage nodes in which the first storage nodes 25 and the second storage nodes 33 are stacked are obtained. Since the first storage nodes 25 and the second storage nodes 33 have the pillar shape, the multi-layered storage nodes become pillar-shaped storage nodes.

Figure 2J:
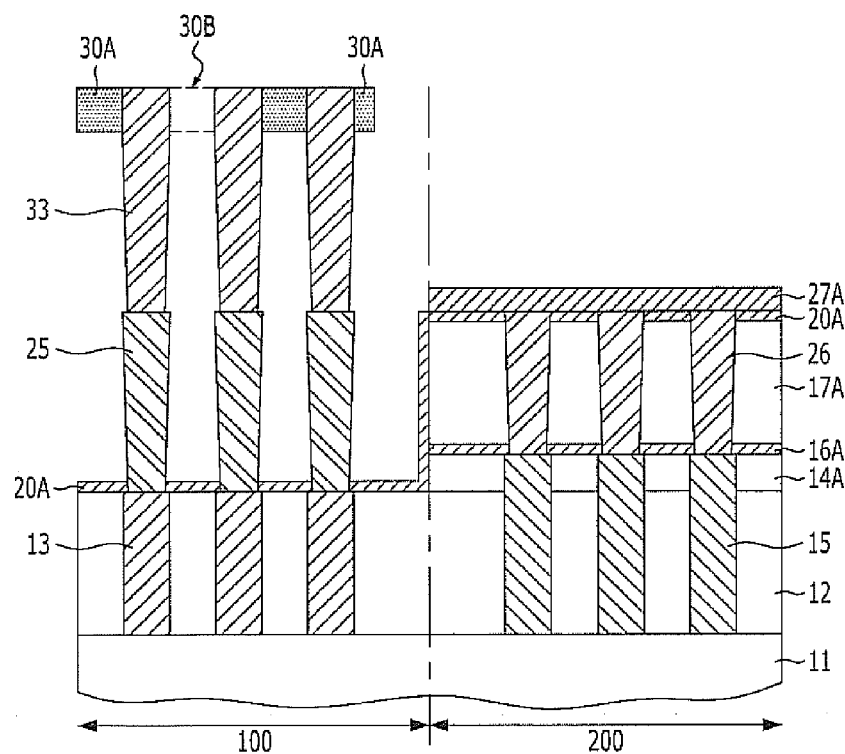

Referring to FIG. 2J, supporters 30A are formed by partially etching the support layer 30. The supporters 30A are formed only in the first region 100 and not in the second region 200. Therefore, when partially etching the support layer 30, the support layer 30 is wholly removed from the second region 200 and is etched only in the first region 100 to have fourth open parts 30B.

A wet dip-out process is performed. The wet dip-out process is performed by supplying a wet chemical, and the wet chemical is supplied through the fourth open parts 30B and removes the mold layer 29. Due to this fact, the mold layer 29 is removed entirely from the first region 100 and the second region 200. The wet dip-out process may be performed using a fluoric acid-based solution. When performing the wet dip-out process, the first and second storage nodes 25 and 33 may be prevented from collapsing, due to the presence of the supporters 30A. Also, when performing the wet dip-out process, due to the presence of the protective layer 27A and the second etch stop layer 20A, the structures in the second region 200 are prevented from being attacked. After the mold layer 29 is removed, the fourth dielectric layer 21 is removed.

By performing the wet dip-out process as described above, the outer walls of the first storage nodes 25 and the second storage nodes 33 in the first region 100 are exposed.

Figure 2K:
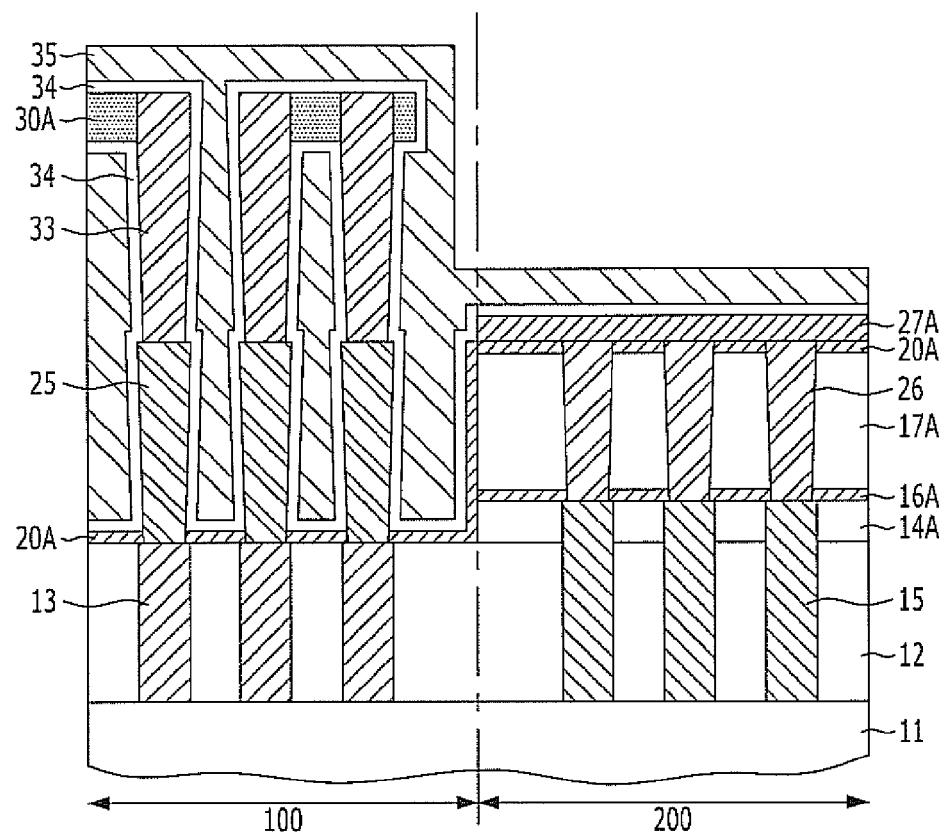

Referring to FIG. 2K, a dielectric layer 34 and a conductive layer 35 are deposited. The dielectric layer 34 may be formed by depositing a high k dielectric substance such as a zirconium oxide ($ZrO_2$), otherwise may be formed as a multi-layered structure of a zirconium oxide-an aluminum oxide ($Al_2O_3$) and a zirconium oxide, that is, a ZAZ multi-layered structure. The conductive layer 35 may be formed by depositing a titanium nitride TiN and tungsten W.

Figure 2L:
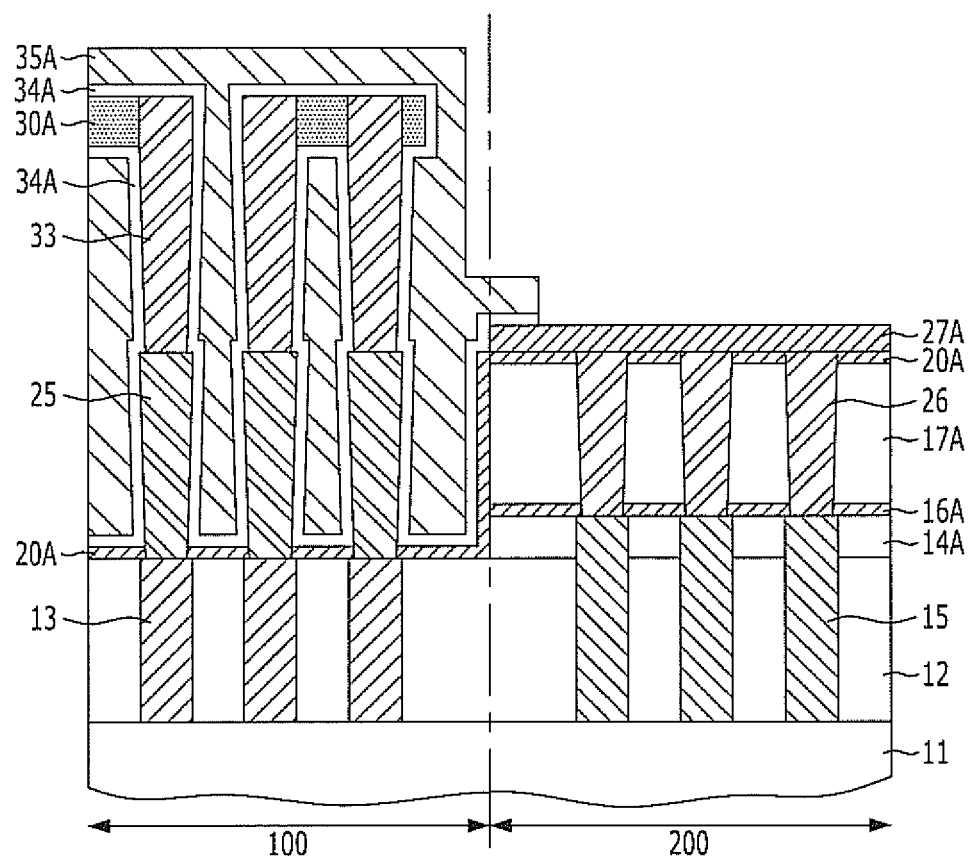

Referring to FIG. 2L, by etching the conductive layer 35, plate nodes 35A are formed in the first region 100. The plate nodes 35A are not formed in the second region 200. When performing an etching process for forming the plate nodes 35A, the structures in the second region 200 are protected by the protective layer 27A. For example, when etching the plate nodes 35A, the metal lines 26 are prevented from being attacked, and due to this fact, the plate nodes 35A and the metal lines 26 are prevented from being short-circuited.

After forming the plate nodes 35A, the dielectric layer 34 may be etched. The dielectric layer 34 remains only in the first region 100 as indicated by the reference numeral 34A.

Meanwhile, when performing the plate etching process, a hydrogen path may be defined by partially etching the second etch stop layer 20A or the protective layer 27A.

Figure 5:
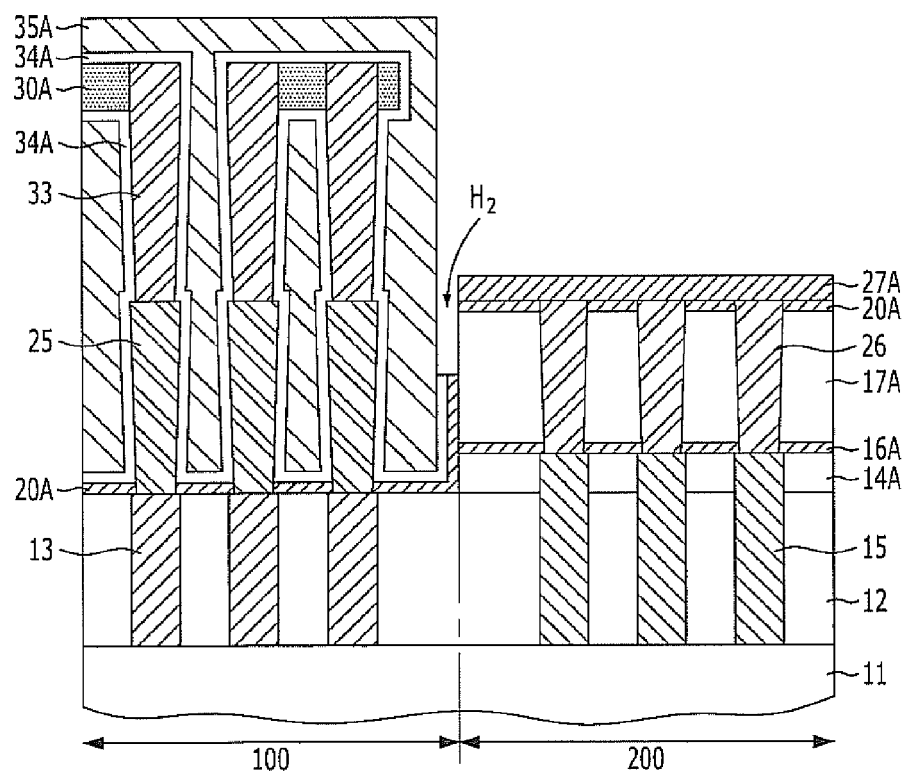
FIG. 5 is a view illustrating a method for defining a path of hydrogen.

FIG. 5 is a view illustrating a method for defining a path of hydrogen.

Referring to FIG. 5, a path of hydrogen ($H_2$) is defined by partially etching the second etch stop layer 20A. By this fact, the number of hydrogen atoms which reach cell transistors during a subsequent annealing process performed under a hydrogen atmosphere as a back-end process is increased, by which the density of interface traps of a cell gate dielectric layer may be significantly decreased. As a result, as the leakage current characteristics of cell transistors are improved, a refresh cycle may be extended. Most semiconductor devices such as a DRAM are fabricated using a hydrogen annealing process as a back-end process. The hydrogen annealing process is very effective in decreasing the density of defects of transistors, in particular, the interface traps of a gate dielectric layer. Hence, in the case of performing the hydrogen annealing process, refresh characteristics may be improved. The hydrogen annealing process is generally performed after forming metal lines and a passivation layer.

In another embodiment, in order to define a path of hydrogen, the protective layer 27A may be etched partially or entirely in the boundary region between the second region 200 and the first region 100. Also, in still another embodiment, the protective layer 27A, the second etch stop layer 20A, the third dielectric layer 17A and the first etch stop layer 16A may be etched in the boundary region between the second region 200 and the first region 100.

Figure 2M:
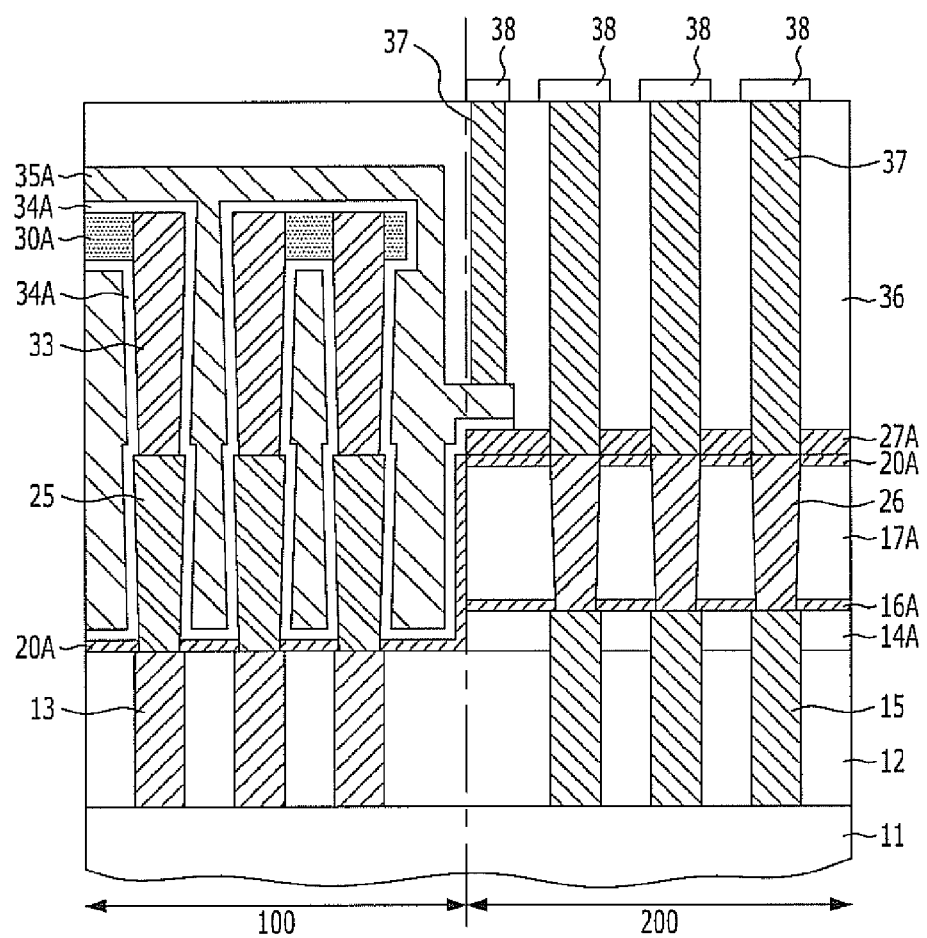

Referring to FIG. 2M, after subsequently forming an interlayer dielectric layer 36, processes for forming first metal contacts (M1C) 37 and first metal lines (M1) 38 may be performed.

As apparent from the above descriptions, in the embodiment of the present invention, as multi-layered storage nodes are formed, capacitance may be sufficiently secured.

Furthermore, since metal lines and storage nodes are simultaneously formed, the number of processing steps may be decreased up to 10~15%.

Moreover, in the embodiment of the present invention, because metal lines and metal contacts are additionally formed, an M1C process margin may be secured. That is to say, contact holes may be prevented from being incompletely open and metal contacts may be prevented from incompletely filling the contact holes during an M1C process.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first dielectric structure over a second region of a substrate to expose a first region of the substrate;
    forming a barrier layer over an entire surface including the first dielectric structure;
    forming a second dielectric structure over the barrier layer in the first region;
    forming first open parts and second open parts in the first region and the second region, respectively, by etching the second dielectric structure, the barrier layer and the first dielectric structure;
    forming first conductive patterns filled in the first open parts and second conductive patterns filled in the second open parts;
    forming a protective layer to cover the second region; and
    removing the second dielectric structure.

2. The method of claim 1, wherein the forming of the first dielectric structure comprises:
    forming an etch stop layer over the substrate;
    forming a first dielectric layer over the etch stop layer;
    forming a first mask over the first dielectric layer to cover the second region; and
    etching the first dielectric layer and the etch stop layer using the first mask as an etch barrier to form a recess in the first region.

3. The method of claim 1, wherein the first open parts and the second open parts are formed using a merged mask as an etch barrier.

4. The method of claim 1, wherein the first open parts have a hole shape and the second open parts have a trench shape.

5. The method of claim 1, wherein each of the barrier layer and the protective layer comprises a nitride layer.

6. The method of claim 2, wherein the forming of the second dielectric structure comprises:
    forming a second dielectric layer over an entire surface including the barrier layer to fill the recess; and
    planarizing the second dielectric layer until the barrier layer in the second region is exposed.

7. The method of claim 1, wherein the forming of the protective layer to cover the second region comprises:
    forming a third dielectric layer over an entire surface including the first conductive patterns and the second conductive patterns;
    forming a second mask over the third dielectric layer to cover the second region; and
    removing the third dielectric layer in the first region by using the second mask as an etch barrier.

8. The method of claim 1, wherein the removing of the second dielectric structure is implemented through a wet dip-out process.

9. The method of claim 1, wherein the first region comprises a cell region, and the second region comprises a peripheral circuit region.

10. The method of claim 1, wherein the first conductive patterns comprise storage nodes.

11. The method of claim 1, wherein the second conductive patterns comprise metal lines.

12. The method of claim 1, further comprising:
    forming third conductive patterns over the first conductive patterns,
    wherein the first conductive patterns are pillar-shaped patterns.

13. The method of claim 1, further comprising:
    forming a path of hydrogen by partially removing the protective layer or the barrier layer in a boundary region between the first region and the second region after the removing of the second dielectric structure.

14. A method for fabricating a semiconductor device, comprising:
    forming a first dielectric structure over a peripheral region of a substrate to expose a cell region of the substrate;
    forming a barrier layer over an entire surface including the first dielectric structure;
    forming a second dielectric structure over the barrier layer in the first region;
    forming first open parts and second open parts in the cell region and the peripheral circuit region, respectively, by etching the second dielectric structure, the barrier layer and the first dielectric structure;
    forming first storage nodes filled in the first open parts and metal lines filled in the second open parts;
    forming a protective layer to cover the peripheral circuit region;
    forming a mold layer over an entire surface including the protective layer;
    forming second storage nodes over the first storage nodes to be connected to the first storage nodes and filled in the mold layer; and
    removing the second dielectric structure and the mold layer.

15. The method of claim 14, wherein the forming of the first dielectric structure comprises:
   forming an etch stop layer over the substrate;
   forming a first dielectric layer over the etch stop layer;
   forming a first mask over the first dielectric layer to cover the peripheral circuit region; and
   etching the first dielectric layer and the etch stop layer using the first mask as an etch barrier to form a recess in the cell region.

16. The method of claim 14, wherein the first open parts and the second open parts are formed using a merged mask as an etch barrier.

17. The method of claim 14, wherein the first open parts have a hole shape and the second open parts have a trench shape.

18. The method of claim 14, wherein each of the barrier layer and the protective layer comprises a nitride layer.

19. The method of claim 15, wherein the forming of the second dielectric structure comprises:
   forming a second dielectric layer over an entire surface including the barrier layer to fill the recess; and
   planarizing the second dielectric layer until the barrier layer in the peripheral circuit region is exposed.

20. The method of claim 14, wherein the forming of the protective layer to cover the peripheral circuit region comprises:
   forming a third dielectric layer over an entire surface including the first conductive patterns and the second conductive patterns;
   forming a second mask over the third dielectric layer to cover the peripheral circuit region; and
   removing the third dielectric layer in the cell region by using the second mask as an etch barrier.

21. The method of claim 14, wherein the removing of the second dielectric structure is implemented through a wet dip-out process.

22. The method of claim 14, wherein the first storage nodes and the metal lines are formed by stacking a titanium layer, a titanium nitride layer and a tungsten layer.

23. The method of claim 22, wherein the second storage nodes comprise a titanium nitride layer and cover the tungsten layer of the first storage nodes.

24. The method of claim 14, further comprising:
   forming a dielectric layer over an entire surface including the second storage nodes after the removing of the second dielectric structure and the mold layer;
   forming a conductive layer over the dielectric layer;
   forming plate nodes by etching the conductive layer; and
   forming a path of hydrogen by partially removing the barrier layer or the protective layer in a boundary region between the cell region and the peripheral circuit region.

25. A semiconductor device comprising:
   a substrate including a cell region and a peripheral circuit region;
   a dielectric structure covering the substrate in the peripheral circuit region;
   a barrier layer formed over an entire surface of the cell region and the peripheral circuit region including the dielectric structure;
   a plurality of storage nodes formed over the substrate in the cell region and passing through the barrier layer;
   a plurality of metal lines formed over the substrate in the peripheral circuit region and passing through the barrier layer and the dielectric structure; and
   a protective layer covering the plurality of metal lines.

26. The semiconductor device of claim 25, wherein upper surfaces of the storage nodes and the metal lines are flush with each other.

27. The semiconductor device of claim 25, wherein the storage nodes have a multi-layered pillar-shaped storage node structure.

28. The semiconductor device of claim 25, wherein the storage nodes have a structure in which pillar-shaped first storage nodes and pillar-shaped second storage nodes are stacked.

29. The semiconductor device of claim 28, further comprising:
   supporters surrounding upper sidewalls of the second storage nodes.

30. The semiconductor device of claim 28, wherein the first storage nodes and the metal lines have a structure in which a titanium layer, a titanium nitride layer and a tungsten layer are stacked, and the second storage nodes comprise a titanium nitride layer.

* * * * *